United States Patent [19]
McElroy

[11] Patent Number: 4,464,734
[45] Date of Patent: Aug. 7, 1984

[54] SEMICONDUCTOR DYNAMIC MEMORY CELL ARRAY WITH WORD LINES EXTENDING INTO WINDOWS OF CAPACITOR PLATE

[75] Inventor: David J. McElroy, Houston, Tex.
[73] Assignee: Texas Instruments Incorporated, Dallas, Tex.
[21] Appl. No.: 399,038
[22] Filed: Jul. 16, 1982

Related U.S. Application Data
[62] Division of Ser. No. 137,705, Apr. 7, 1980.
[51] Int. Cl.³ ............................................. G11C 11/24
[52] U.S. Cl. ....................................... 365/51; 365/149
[58] Field of Search ................. 365/51, 174, 182, 189, 365/230, 178, 149

[56] References Cited
U.S. PATENT DOCUMENTS
4,193,125 3/1980 Moriya .................................. 365/51

Primary Examiner—Terrell W. Fears
Attorney, Agent, or Firm—John G. Graham

[57] ABSTRACT

A dynamic read/write memory cell of the one transistor type is made by a single-level polysilicon process in which the word lines and the gates of the access transistors are formed by the metal strips. No metal-to-silicon or metal-to-polysilicon contacts are needed. The access transistors are made by etching through polysilicon strips which are the capacitor bias plates. The size of the transistor is not determined by alignment accuracy.

9 Claims, 1 Drawing Figure

SEMICONDUCTOR DYNAMIC MEMORY CELL ARRAY WITH WORD LINES EXTENDING INTO WINDOWS OF CAPACITOR PLATE

This is a division of application Ser. No. 137,705, filed Apr. 7, 1980.

BACKGROUND OF THE INVENTION

This invention relates to semiconductor memory devices and method of manufacture, and more particularly to a one-transistor dynamic read/write memory cell array.

Dynamic read/write memory cells made by the double-level polysilicon N-channel self-aligned process commonly used in the industry are shown in pending U.S. patent application Ser. Nos. 648,594, filed Jan. 12, 1976 and 722,841, filed Sept. 13, 1976, by C-K Kuo, both assigned to Texas Instruments, as well as in Electronics, Feb. 19, 1976, pp. 116–121, May 13, 1976, pp. 81–86, and Sept. 28, 1978, pp. 109–116.

Although the double-level polysilicon process has proved to be quite successful and many hundreds of millions of memory devices have been made in this way, there is nevertheless added cost and degradation in yield due to the additional process steps compared to a single level process. Further, the classic cell layout uses a transistor which has a channel length determined by the amount of overlap of the two poly levels, making the characteristics of the transistor difficult to control. Another problem is the necessity of making metal-to-polysilicon contacts to connect the row lines to the gate.

It is the principal object of this invention to provide an improved dynamic read/write memory cell. Another object is to provide a dynamic memory of small cell size. An additional object is to provide a dense array of dynamic memory cells, made by a more efficient method. A further object is to provide an improved way of making dynamic memory cells without using metal-to-polysilicon contacts in the array. Another object is to avoid relying upon allignment precision in defining transistor channel lengths in dynamic memory cells.

SUMMARY OF THE INVENTION

In accordance with an illustrative embodiment of the invention a dynamic read/write memory cell of the one transistor type is made by a single-level polysilicon process in which the word lines and the gates of the access transistors are formed by metal strips. No metal-to-silicon or metal-to-polysilicon contacts are needed. The access transistors are made by etching through polysilicon strips which are the capacitor bias plates. The size of the transistor is not determined by allignment accuracy.

BRIEF DESCRIPTION OF THE DRAWINGS

The novel features believed characteristic of the invention are set forth in the appended claims. The invention itself, however, as well as other features and advantages thereof, will be best understood by reference to the detailed description drawing, wherein:

FIGS. 2 through 4d, inclusive, of my U.S. Pat. No. 4,345,364 are incorporated herein by reference.

DETAILED DESCRIPTION OF A SPECIFIC EMBODIMENT

Figure 1:
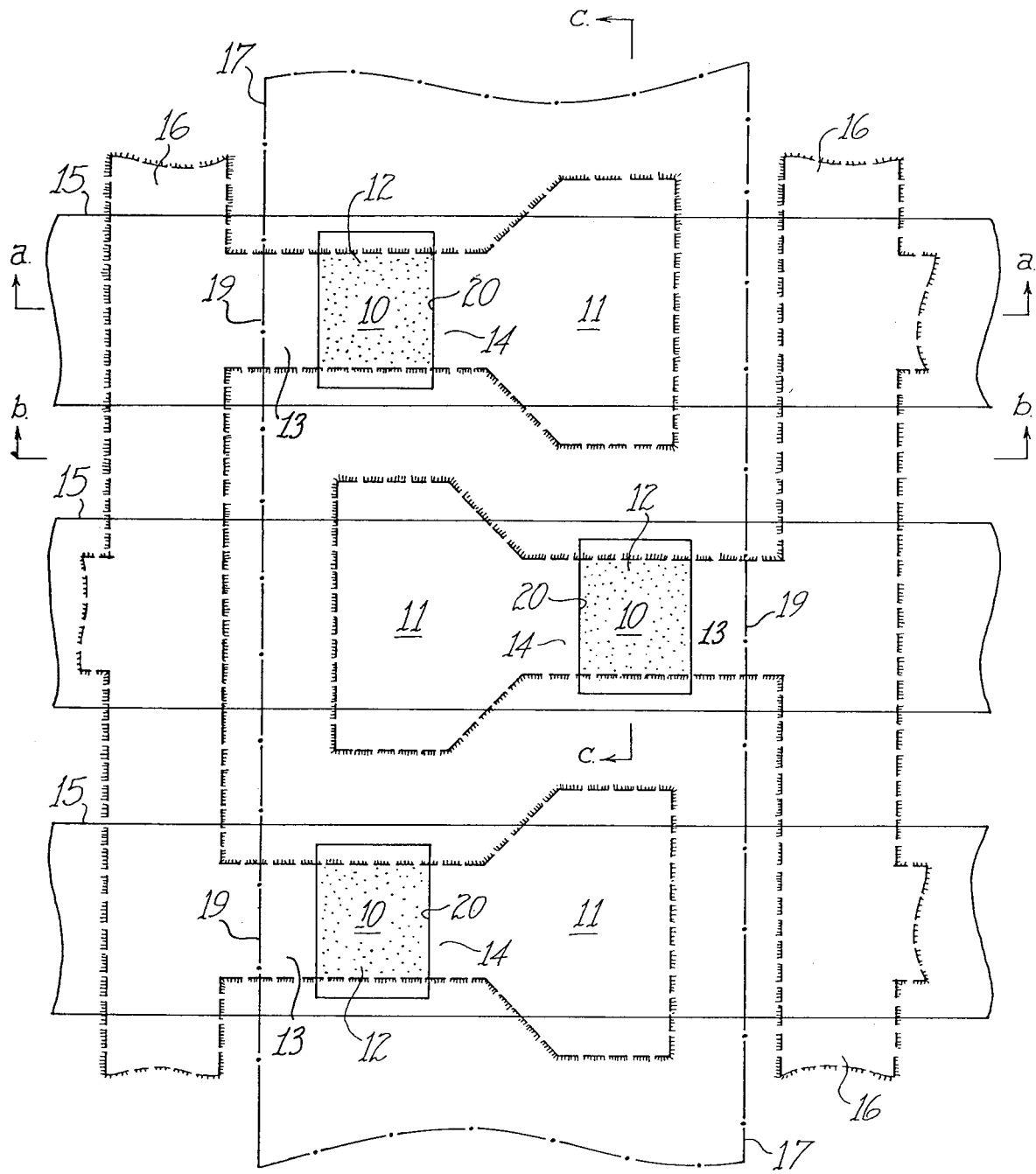
FIG. 1 is a greatly enlarged plan view of a small portion of a semiconductor chip showing the physical layout of a part of a dynamic memory cell array employing cells made according to the invention.

The array consists of a large number of cells, each with an access transistor 10 and a capacitor 11. The access transistor 10 has a gate 12, a source 13 and a drain 14. The gates 12 are parts of elongated metal strips 15 which are the X or word address lines for the array. The sources 13 are inverted surface regions connected to N+ diffused moat regions 16 which are the bit lines or Y output lines. The capacitors 11 include a first level polysilicon bias gate 17 which is part of an elongated strip of polysilicon extending along the entire array and connected to the Vcc supply, ordinarily +5 V. The lower plates of the capacitors 11 are created by inverted regions 18 beneath the gates 17. The source region 13 is also inverted by the voltage on the segment 19 of the strip 17. The transistors 10 are formed in holes 20 in the strip 17.

A thin gate oxide layer 22 separates the first level polysilicon bias strip 17 from the silicon surface, and thin gate oxide layer 23 separates the metal gate 12 from the silicon; an oxide coating 24 separates the metal line 15 from the poly 17 and 19 in each cell. A thick layer 25 of low temperature deposited oxide overlies the upper surface of the bar. A thick thermal field oxide coating 26 covers parts of the bar not occupied by the transistors or diffused interconnects (moat regions), and P+ channel stop regions 27 are formed underneath all the thick field oxide.

The array is formed on a silicon bar 30 which would typically contain perhaps 64K or 256K bits on a bar less than 200 mils on a side or 40,0000 square mil area, depending upon the bit density. The three cells shown would be on a minute part of the bar perhaps about one mil wide. A 64K cell array would require 256 of the metal X address lines 15 and 256 of the N+ diffused Y lines 16, providing 65,536 bits.

In FIGS. 4a–4d of my U.S. Pat. No. 4,345,364, incorporated herein by reference, a process for making the cell array according to the invention is described.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A semiconductor memory device of the type including an array of one-transistor dynamic memory cells in a face of a semiconductor body, comprising:
   a plurality of semiconductor regions in said face of the semiconductor body, said regions being laterally spaced from one another along said face, each region providing one end of a source-to-drain path of an access transistor in each cell,
   conductive means extending laterally along said face insulated therefrom by an insulating layer and providing a plurality of capacitor areas in said face, one capacitor area for each of said cells, and
   a plurality of elongated conductive strips at said face overlying said regions providing gates of access transistors for each of said cells and extending into windows in said conductive means, the strips providing the gate of an access transistor for each of said cells.

2. A device according to claim 1 wherein each of said semiconductor regions is elongated and provides one end of a source-to-drain path of a large number of insulated gate field effect transistors in a column which are said access transistors.

3. A device according to claim 2 wherein each of the gates is laterally spaced along the face from said one end by an inverted region beneath said conductive means.

4. A device according to claim 2 wherein said conductive means include a plurality of elongated conductive layers forming capacitor bias lines.

5. A device according to claim 4 wherein said conductive strips are metal and form row address lines.

6. A device according to claim 5 wherein each of said elongated conducted layers overlies a plurality of separate capacitor areas, one for each cell laterally spaced along said face.

7. A device according to claim 6 wherein said conductive means is connected to a bias voltage source to create an inverted region at each of said capacitor areas and adjacent each of said semiconductor regions.

8. A device according to claim 6 wherein the body is predominately P-type silicon, said semiconductor regions are N+ type, said condutive means is polycrystalline silicon, and said conductive strips are metal.

9. A device according to claim 6 wherein said cells are in an array of rows and columns, and there are a plurality of said conductive strips, one extending along each row and each conductive strip overlies a plurality of said separate capacitor areas, one for each cell.

* * * * *